(12) United States Patent
Blanton et al.

(10) Patent No.: US 6,673,388 B2
(45) Date of Patent: Jan. 6, 2004

(54) METHOD OF MAKING A PRINTED CIRCUIT BOARD

(75) Inventors: Thomas N. Blanton, Rochester, NY (US); Syamal K. Ghosh, Rochester, NY (US); Donn B. Carlton, Hamlin, NY (US); Dilip K. Chatterjee, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 180 days.

(21) Appl. No.: 09/844,019

(22) Filed: Apr. 27, 2001

(65) Prior Publication Data
US 2002/0192392 A1 Dec. 19, 2002

(51) Int. Cl.$^7$ .............................. B05D 5/12; B05D 3/02
(52) U.S. Cl. .................... 427/79; 427/80; 427/126.3; 427/226; 427/554; 427/557; 361/271; 361/500
(58) Field of Search .................... 427/79, 80, 126.3, 427/554, 555, 581, 557, 226; 361/271, 500

(56) References Cited

U.S. PATENT DOCUMENTS

| | | | |
|---|---|---|---|
| 4,328,303 A | * 5/1982 | Ronn et al. .................. 430/290 |
| 4,520,114 A | * 5/1985 | David .......................... 501/12 |
| 4,572,843 A | * 2/1986 | Saito et al. .................. 427/554 |
| 4,880,770 A | 11/1989 | Mir et al. |
| 4,963,390 A | * 10/1990 | Lipeles et al. .............. 427/110 |
| 5,217,754 A | * 6/1993 | Santiago-Aviles et al. .. 427/226 |
| 5,248,998 A | 9/1993 | Ochiai et al. |
| 5,311,218 A | 5/1994 | Ochiai et al. |
| 5,365,645 A | 11/1994 | Walker et al. |
| 5,383,027 A | 1/1995 | Harvey et al. |
| 5,534,312 A | * 7/1996 | Hill et al. .................... 427/533 |
| 5,598,196 A | 1/1997 | Braun |
| 5,600,357 A | 2/1997 | Usui et al. |
| 5,688,391 A | 11/1997 | Hayes |
| 5,824,123 A | * 10/1998 | Chatterjee et al. ............ 51/309 |
| 5,889,234 A | 3/1999 | Ghosh |
| 6,455,106 B1 | * 9/2002 | Qiu et al. ................. 427/372.2 |

* cited by examiner

Primary Examiner—Brian K. Talbot
(74) Attorney, Agent, or Firm—Raymond L. Owens

(57) ABSTRACT

A method of making a charge containing element including the steps of depositing and patterning a dielectric material on a surface wherein the dielectric material includes a metallo-organic component and a liquid component; and decomposing by laser light the deposited dielectric material to substantially evaporate the liquid component to cause the metallic portion of the metallo-organic component to react with oxygen causing the dielectric material to have charge-holding properties.

17 Claims, 4 Drawing Sheets

METHOD OF MAKING A PRINTED CIRCUIT BOARD

FIELD OF THE INVENTION

The present invention relates to forming a charge-containing element, which is useful as a capacitor on a printed circuit board.

BACKGROUND OF THE INVENTION

Ceramic oxide layers are diverse in their properties. Apart from their unusually high mechanical strength, high wear and abrasion resistance, and high corrosion resistance, they can be considered to be dielectric, ferroelectric, piezoelectric, or optoelectronic materials. They can also be utilized in both electrical and thermal insulation applications. These ceramic oxides can be crystalline or amorphous.

Layers of ceramic materials can be manufactured using physical vapor deposition (PVD) and chemical vapor deposition (CVD), laser ablation, dip and knife coating of a ceramic precursor material, and metallo-oxide decomposition (MOD) as shown by Mir et al in commonly-assigned U.S. Pat. No. 4,880,770.

However the above-mentioned processes are time consuming, involving numerous steps for realization of the final product. In addition, the above mentioned processes are not discreet enough to selectively deposited the dielectric materials in the desired configuration or location.

Formation of dielectric material normally requires high temperature processing. This high temperature processing restricts the choice of substrates that can be selected for use. Capacitors are multilayer coatings comprised of an arrangement of conductive, dielectric, and conductive layers in sequence. There is a need for forming dielectric materials on a substrate in many applications such as capacitive devices. Capacitors are essentially materials with high dielectric constants. Dielectric (which is essentially electrically non-conducting) characteristic of ceramic materials are well known and getting increasing importance as the field of solid state electronics continues to expand rapidly. The principal applications for ceramic dielectrics are as capacitive elements in electronic circuits and as electrical insulation. For these applications, the properties of most concern are the dielectric constant, dielectric loss factor, and dielectric strength. The principal characteristics of a capacitor are that an electric charge can be stored in that capacitor and the magnitude of the charge which can be stored is dependent primarily on the nature of the material, grain size, and the impurity distribution at the grain boundaries.

As mentioned earlier, there are problems with conventional deposition methods. It is felt that the method of delivery of the metallo-organic precursor requires the development a novel approach in order to reduce the time required to manufacture dielectric components and reduce the waste involved during conventional manufacturing processes.

Ink jet printing is commonly utilized for delivery of liquid ink onto a receiver. An ink jet printhead made from a piezoelectric material is used to selectively eject ink droplets onto a receiver to form an image. Within the printhead, the ink may be contained in a plurality of channels and energy pulses are used to actuate the printhead channels causing the droplets of ink to be ejected on demand or continuously, through orifices in a plate in an orifice structure. The delivery of metallo-organic precursor material in a liquid state can be made utilizing ink jet printers utilizing suitable printheads onto selected substrates.

In one representative configuration, a piezoelectric ink jet printing system includes a body of piezoelectric material defining an array of parallel open topped channels separated by walls. In the typical case of such an array, the channels are micro-sized and are arranged such that the spacing between the adjacent channels is relatively small. The channel walls have metal electrodes on opposite sides thereof to form shear mode actuators for causing droplets to expel from the channels. An orifice structure comprising at least one orifice plate defining the orifices through which the ink droplets are ejected, is bonded to the open end of the channels. In operation of piezoelectric printheads, ink is directed to and resides in the channels until selectively ejected therefrom. To eject an ink droplet through one of the selected orifices, the electrodes on the two side wall portions of the channel in operative relationship with the selected orifice are electrically energized causing the side walls of the channel to deflect into the channel and return to their normal undeflected positions when the applied voltage is withdrawn. The driven inward deflection of the opposite channel wall portions reduces the effective volume of the channel thereby increasing the pressure of the ink confined within the channel to force few ink droplets, 1 to 100 pico-liters in volume, outwardly through the orifice. Operation of piezoelectric ink jet printheads is described in detail in U.S. Pat. Nos. 5,598,196; 5,311,218; 5,365,645, 5,688,391, 5,600, 357, and 5,248,998.

SUMMARY OF THE INVENTION

It is an object of the present invention to provide an improved method of making a patterned charge-containing element.

It is another objective of the present invention to provide a method of depositing and patterning a dielectric material on a conductive portion of a substrate to form a patterned charge-containing element.

In one aspect, these and other objects of making patterned charge-containing elements are achieved by a method comprising the steps of:

(a) depositing and patterning a dielectric material on a surface by a precision precursor delivery head wherein the dielectric material includes a metallo-organic component and a liquid component; and (b) thermally decomposing by laser light the deposited dielectric material to substantially evaporate the liquid component to cause the metallic portion of the metallo-organic material to react with oxygen causing the dielectric material to have charge-holding properties wherein the dielectric material includes a metallo-organic component and a liquid component.

It is a further object of the present invention to provide a method of depositing and patterning by a precision precursor delivery head, which responds to electrical signals to provide the dielectric material at predetermined positions.

It is still a further object of the present invention to provide a conductive portion over a substrate and forming the patterned dielectric material on such conductive portions.

It is still another object of the present invention to provide a method of converting the dielectric material at predetermined positions to electrically conductive material using a Nd-YAG laser source having wavelength 1.06 $\mu$m.

The present invention is particularly suitable to provide a dielectric layer for a multilayer capacitor, flexible capacitor, capacitor integrated to circuit boards, camera body, cellular phone, personal digital assistant, pace maker, hand held electronic devices, and related components.

This invention provides a convenient way to have fully completed solid state reactions to produce desired chemistries in material layer. It is easy to control various crystallographic phases of the material by simplified doping methods.

It is an advantage of the present invention that the dielectric layer can be made using a low cost ink jet printer, which permits controlled and selective delivery of the metallo-organic precursor having high degree of thickness uniformity, and ability to deposit in a cost effective manner.

This invention overcomes many of the problems that are associated with conventional methods of fabricating printed circuit boards, multilayer capacitors, flexible capacitors, capacitors integrated onto circuit boards, and protective coatings on metals, alloys, polymers, organics, inorganics, composites, glasses, paper, photographic film, magnetic media, or ceramic substrates or combinations thereof both flexible and rigid in form.

DETAILED DESCRIPTION OF THE PREFERRED EMBODIMENTS

This invention refers to a dielectric layer, which can be used in an article having electrical capacitive properties in which selectively the electrical charges can be trapped or discharged on demand. The present invention has particular applicability in forming an article, which has identified elements. Since a dielectric material frequently is used to make use of its capacitive properties, articles formed by the present invention can be used in capacitors that can be individually addressed. When addressed such a capacitor can be discharged.

Figure 1:
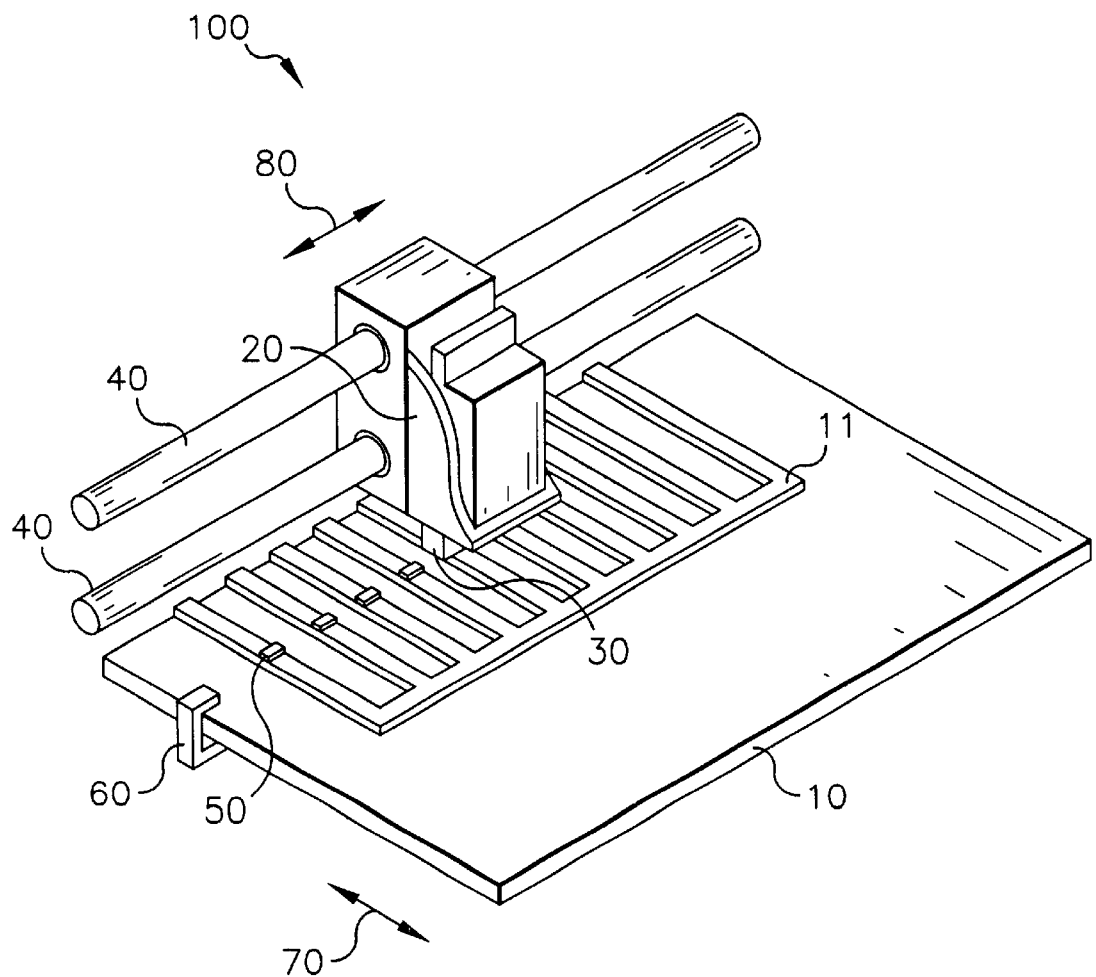
FIG. 1 is a perspective of a single-head precision precursor delivery and curing system for a rigid or flexible substrate showing deposition of precursor droplets.

Turning now to FIG. 1, there is shown a perspective of a single-head precision precursor delivery and curing system 100, which in many respects is identical to an ink jet printer, and can be used in accordance with the present invention.

The precursor is deposited in the form of droplets 50 along the precursor delivery head direction 80 on a substrate (receiver) 10 by means of a delivery nozzle 30 located in a precursor delivery head 20. It will be understood that the substrate 10 can be a printed circuit board, which has other components that are either formed prior to or after making capacitors. The droplets 50 are generally deposited onto conductive portions 11 of the substrate 10. The substrate 10, which moves along the substrate (receiver) direction 70, can be flexible or rigid and the substrate 10 can be generally made from polymers, polymeric composites, paper, photographic film, magnetic media, or ceramic substrates or combinations thereof. A flexible substrate 10 can have a thickness in the range of 0.1 to 10.0 mils, preferably 1 to 5 mils. Furthermore, the flexible substrate 10 can be wound around a mandrel that is at least 1 millimeter in diameter.

Those substrates 10, which are thicker than 10.0 mils or cannot be wrapped around a mandrel having at least 1-millimeter diameter, are considered rigid substrates. The precursor delivery head 20 is mounted on at least one guide rail 40, or preferably more than one, guide rails 40 for precursor delivery head direction 80 of the precursor delivery head 20. The guide rails 40 are driven by a motor (not shown) which in turn causes the precursor delivery head 20 to travel from one edge of the substrate 10 to the other while the substrate (receiver) direction 70 is traverse to that of precursor delivery head 20. An edge guide 60 is provided for properly locating and guiding the substrate 10.

Figure 2:
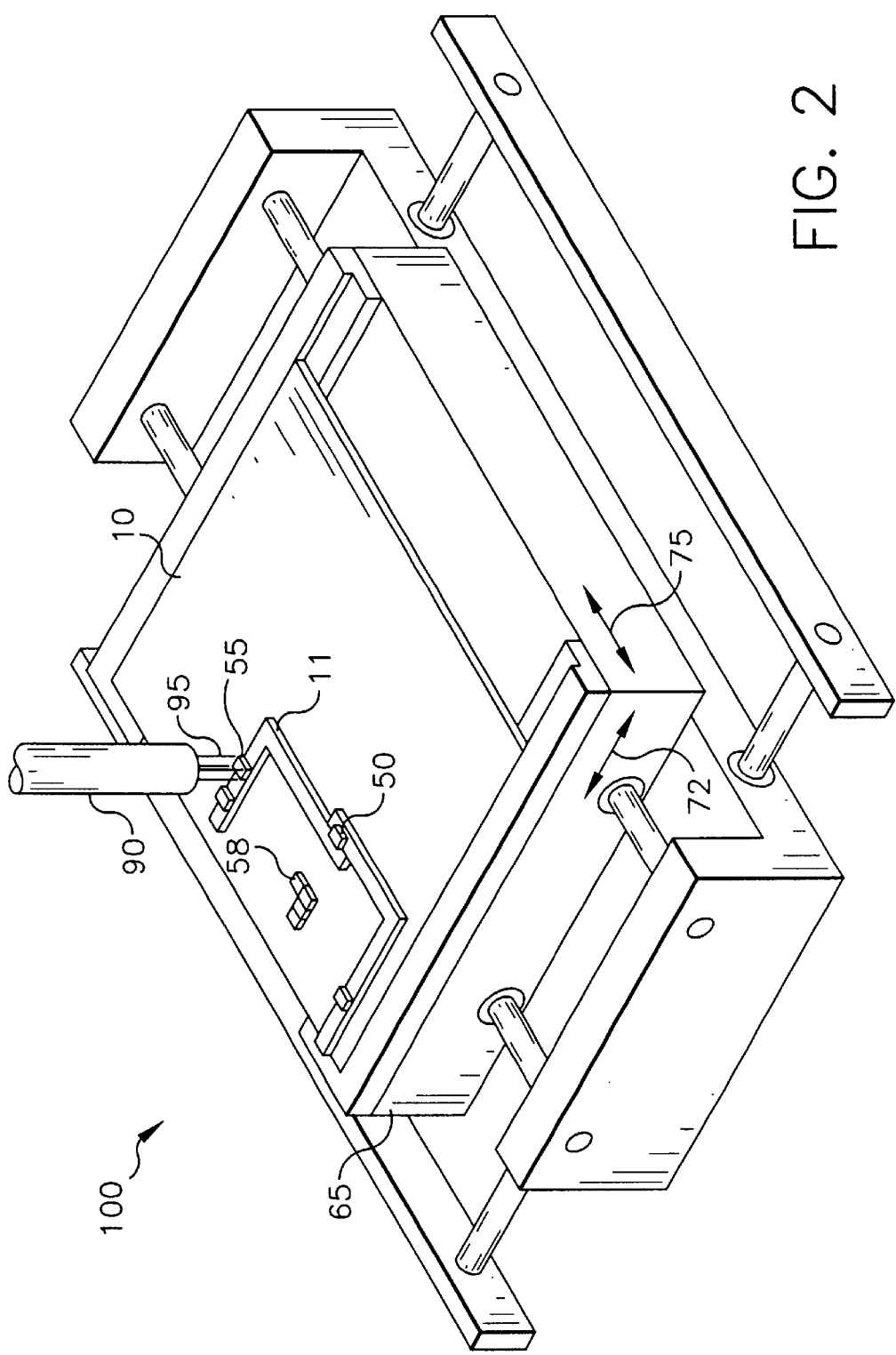
FIG. 2 is a perspective of a single-head precision precursor delivery and curing system for a rigid or flexible substrate as shown in FIG. 1, showing sequential laser curing method following deposition of droplets.

FIG. 2 shows a partial perspective of the precursor delivery and curing system 100 of FIG. 1, wherein an alternative embodiment of sequential laser assisted thermal curing process following deposition of precursor droplets is accomplished. FIG. 2 shows an IR laser source 90, like $CO_2$, which produces a laser beam 95 and that is used to thermally cure the deposited precursor droplet 50 to form the cured dielectric element 55 after it is being deposited on the conductive portion 11 of the substrate 10. These cured dielectric elements 55 form capacitors. FIG. 1 shows a substrate (receiver) direction 70, whereas, alternatively, the substrate 10 can be translated on X-Y translation stage 65 through X-movement direction 72 and Y-movement direction 75 as shown in FIG. 2. A second IR laser source like Nd-YAG (not shown) having 1.06 $\mu$m wavelength can also be used to transform the cured dielectric element 55, to electrically conductive element 58. Alternatively, the second IR laser source can be the one and the same laser source 90 needed for curing the droplets to form the cured dielectric element 55 using different laser operating parameters.

Figure 3:
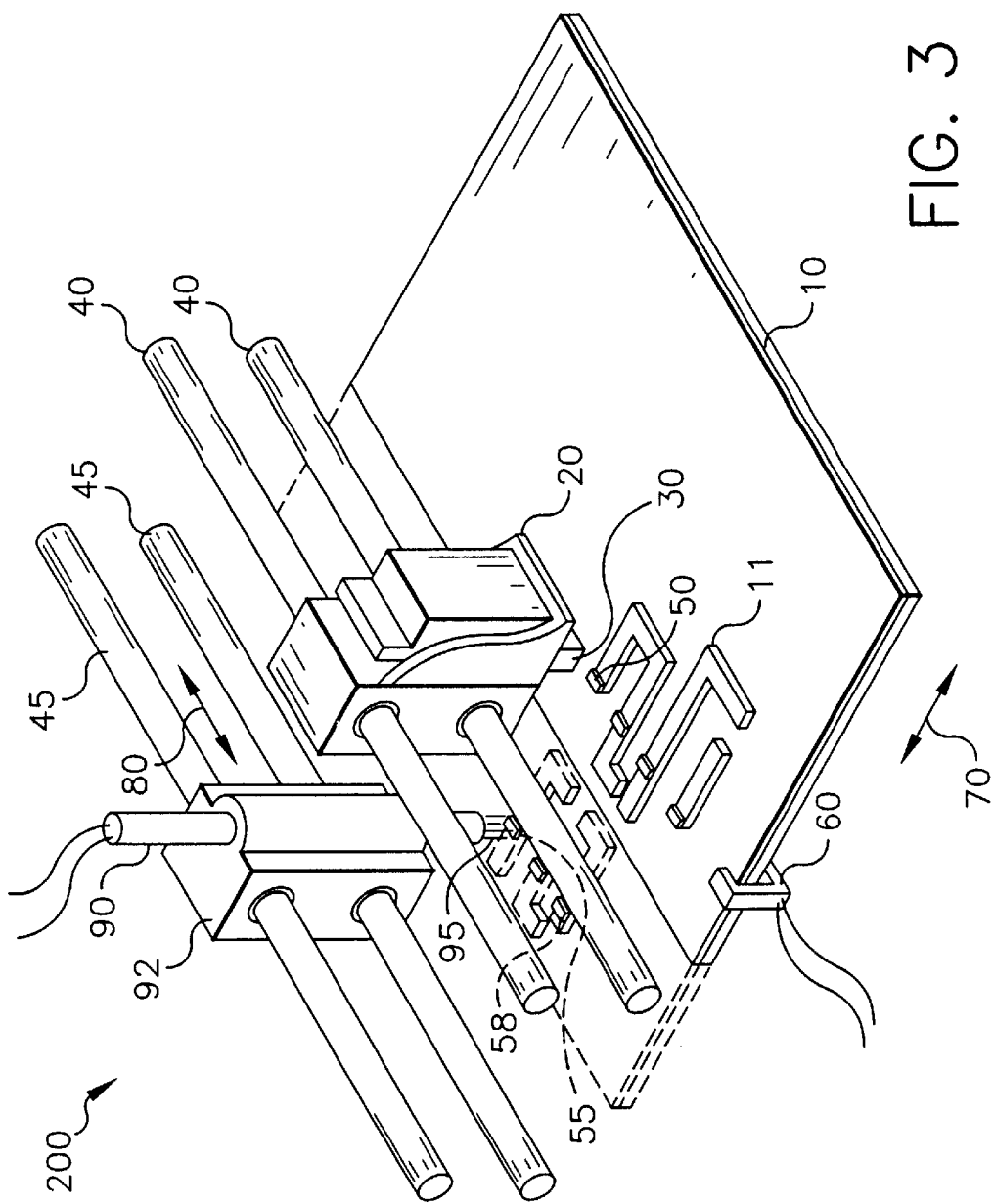
FIG. 3 is a perspective of a simultaneous single-head precursor delivery and laser curing arrangement.

FIG. 3 shows another alternative embodiment of precursor delivery and curing method. FIG. 3 shows simultaneous single-head precursor delivery and laser curing system 200 wherein the precursor droplet delivery step is immediately followed by precursor curing step to form cured dielectric element 55 which is followed by the final laser transformation process to form electrically conductive element 58. A laser housing 92 is mounted on a at least one guide rail 45, or preferably more than one guide rails 45, in close proximity to a precursor delivery head 20. An IR laser beam 95 transforms the cured dielectric element 55 to electrically conductive element 58.

Figure 4:
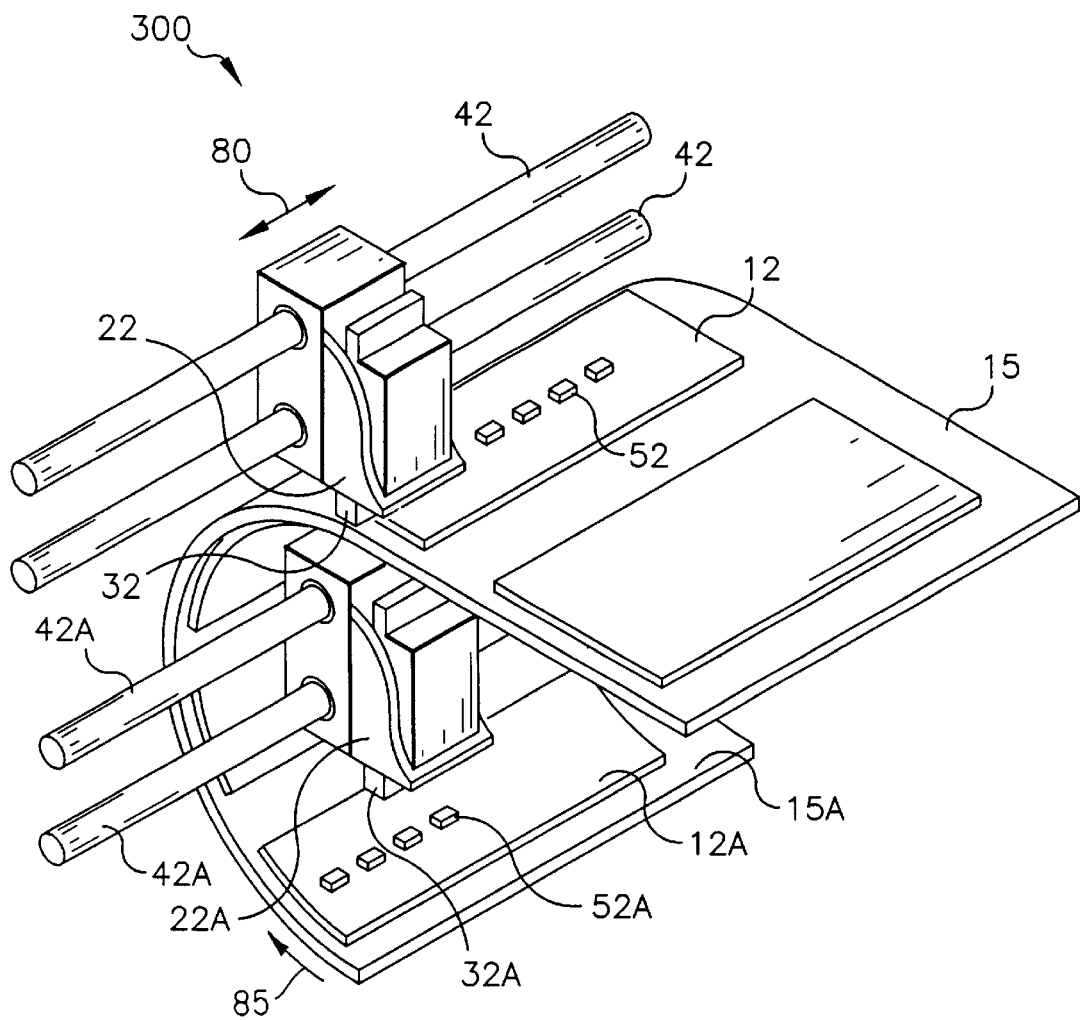
FIG. 4 is a perspective of a dual-head precursor delivery system for depositing precursor droplets on both sides of a flexible or rigid substrate.

FIG. 4 shows a two-sided precursor delivery system for rigid or flexible substrate 300 for depositing precursor droplets 52, 52A on conductive portions top side 12 and conductive portions bottom side 12A of the top and bottom surfaces or sides respectively of a rigid or flexible substrate 15, 15A; top and bottom sides respectively. Identical precursor delivery heads 22, 22A are spaced apart such that the precursor droplets 52, 52A top and bottom sides respectively are deposited from delivery nozzles 32, 32A respectively, on the conductive portions top side 12 and conductive portions bottom side 12A of both sides of the substrate 15, 15A top and bottom sides respectively. The precursor delivery heads 22, 22A are mounted on at least one guide rail 42, 42A respectively, or preferably more than one guide rails 42, 42A. The substrate 15, 15A is translated through flexible receiver movement direction 85. The next steps of thermal curing by a laser 90 and laser transformation from dielectric to conductive elements are the same as described hereinbefore.

As will be described later in this disclosure through the impingement of infrared radiation upon the droplet 50, cured element 55, and electrically conductive element 58 can be formed. The formation of the electrically conductive element 58 on the surface of the substrate 10 or the flexible substrate 15, 15A is a feature of this invention by selectively discharging certain ones of the elements. Each cured and electrically conductive element 55 and 58, respectively on the substrate 10 or flexible substrate 15, 15A is in effect a capacitor which can be used to accept stored charge or discharge stored charge depending on the configuration of the electrical connections.

Capacitors made in accordance with the present invention can have a multi-layer structure in which one of the coatings is electrically conductive and one or more of the other layers are dielectrics that can hold the charge and can be selectively converted to have electrically conductive areas or regions by altering the chemical composition of those regions.

The present invention makes use of ceramic materials, which can be used, in capacitive elements in electronic circuits and as electrical insulation. For these applications, the properties of most concern are the dielectric constant, dielectric loss factor, and dielectric strength. The principal characteristics of a capacitor is that an electric charge can be stored in that capacitor and the magnitude of the charge which can be stored is dependent primarily on the nature of the material, grain size, and the impurity distribution at the grain boundaries. The elements of FIGS. 2 and 3 can use a ceramic material which has a surface region changed from a dielectric to a conductor by the application of laser light as will be described later.

According to the present invention one or more dielectric layers are formed for storing the electrical charges that can utilize any ceramic oxides or any material having a high dielectric constant. A dielectric layer can, for example, be formed on a conductive layer wherein the dielectric layer is formed by the thermal decomposition of an organic component of the dissolved metallo-organic component and a reaction of the metallic portion of the material with oxygen thereby causing the dielectric layer to have charge holding properties.

Oxide ceramics are commonly prepared by solid state reactions and sintering of metal oxide/carbonate mixtures. Since they usually are physical mixtures, they require prolonged grinding/heating cycles to complete the solid state reactions. Sometimes, it is even extremely difficult to have fully completed solid state reactions. This difficulty has led to considerable interests in the preparation of materials by chemical methods for achieving stoichiometric control, "atomic level" homogeneity and for reduction of processing times and temperatures. One of such chemical methods of coating and producing ceramic or other metal or alloy structures, particularly in thick and thin layer form is Metallo-Organic-Decomposition (MOD). Metallo-Organic-Decomposition is a convenient non-vacuum technique for the deposition of various types of inorganic layers. It includes coating a precursor solution (such as, metal carboxylates, metal alkoxides etc.) containing the desired cations in the desired proportions onto a substrate followed by solvent removal and thermal decomposition. MOD is a simple technique for layer deposition with low cost equipment requirements, and permits excellent control of overall stoichiometry, high uniformity of thickness and composition, and ability to coat irregular substrate shapes in a cost effective manner.

Any material with high dielectric constant can be utilized for storage of electric charge, hence capacitor material. In the present invention, only zirconium oxide material is chosen for experimental purposes and cited as examples through which reduction in practice is established.

Three zirconia precursor materials were selected for coating on some rigid electrically insulating ceramic materials, such as alumina, and also on some flexible insulating materials, such as flexible polyimide polymer substrate.

These are: (a) Zirconium 2-Ethylhexanoate, 90% zirconium content (packaged under nitrogen), bought from Gelest, Inc.; (b) Zirconium Octoate (in mineral spirits), 6% zirconium content, bought from Pfaltz & Bauer, Inc.; (c) Zirconium Tetra-n-butoxide (in N-Butanol), 80% zirconium content, bought from Pfaltz & Bauer, Inc. These precursor materials were normally diluted with toluene in 50:50 proportion before depositing onto a substrate, because experience showed that undiluted precursors were difficult to deposit. After depositing the precursor droplets on the substrates using the precursor delivery head, those droplets were cured using an IR laser before they were selectively treated with a Nd-YAG laser for converting the cured element to electrically conductive element. The curing process may be described as converting the liquid droplets to dry droplets by thermally driving out the liquid component of the precursor and oxidizing the precursor in ambient air to form a dielectric oxide.

Converting certain thickness of the dielectric element (zirconia) to an electrically conductive element was done adopting the method used by Ghosh, et. al in commonly-assigned U.S. Pat. No. 5,889,234, the disclosure of which is incorporated by reference herein. A dielectric element having electrically conductive surface is made by modifying the chemical composition of the surface using infrared laser energy. Through the impingement of infrared laser radiation upon the surface of the element, an electrically conductive element is produced on the surface. In such manner, the entire surface can be made electrically conductive or a particular pattern can be traced. A Nd-YAG laser with a wavelength of 1.06 $\mu$m was utilized. As an integral part of the element, the conductive surface layer will not delaminate from the element. Further, because the modified surface region and the element are both a zirconia, the coefficients of thermal expansion of the element and the modified surface region will be closely matched. These types of laser assisted chemical changes were made on zirconia or its composites coated on electrically conductive metallic and electrically non-conductive polymeric or plastic substrates as described above. This type of multilayer structure forms the basis for element formation as described earlier. In the case of flexible polyimide polymer substrates the surface opposite to the laser treated electrically conductive surface can be coated with some conductive metallic or alloy layers by PVD, CVD, Sol-Gel and, and dip-coating methods. Suitable electrodes were configured so that the novel capacitor is effective.

This invention can be used in articles having a dielectric layer on a very thin polymer, composites, or ceramic substrates which are generally electrically non-conductive flexible material layer where elements can be fully or selectively converted to either electrically conductive or electrically insulating elements by altering the chemical composition of those regions, thus forming a flexible or rigid capacitor.

This invention also provides a method of fabricating the above mentioned articles at a low temperature so that the substrates are not adversely affected by the process of formation of the article.

The above described precursor materials for formation of zirconia layer were doped with a precursor, which translated to yttria, a crystal modifying dopant. The doping was done through Y-Acetylacetonate. The amount of dopant controls the crystalline phase, and for example, an appropriate amount of dopant to produce 0, 9, 30 mole % yttria were added and thoroughly mixed with Zirconium 2-Ethylhexanoate, Zirconium Octoate, and Zirconium Tetra-n-butoxide, before they were coated on the substrates.

The invention has been described in detail with particular reference to preferred embodiments thereof, but it will be understood that variations and modifications can be effected within the spirit and scope of the invention.

PARTS LIST

| | |
|---|---|
| 10 | substrate (receiver) |
| 11 | conductive portion |
| 12 | conductive portion top side |
| 12A | conductive portion bottom side |
| 15 | flexible substrate (flexible receiver) top side |
| 15A | flexible substrate (flexible receiver) bottom side |
| 20 | precursor delivery head |
| 22 | precursor delivery head top side |
| 22A | precursor delivery head bottom side |
| 30 | delivery nozzle |
| 32 | delivery nozzle top side |
| 32A | delivery nozzle bottom side |
| 40 | guide rail for precursor delivery head |
| 42 | guide rail for precursor delivery head top side |
| 42A | guide rail for precursor delivery head bottom side |
| 45 | guide rail for laser |
| 50 | droplet |
| 52 | droplet top side |
| 52A | droplet bottom side |
| 55 | cured dielectric element |
| 58 | electrically conductive element |
| 60 | edge guide |
| 65 | X-Y translation stage |
| 70 | substrate (receiver) direction |
| 72 | X-movement direction |
| 75 | Y-movement direction |
| 80 | precursor delivery head direction |
| 85 | flexible receiver movement direction |
| 90 | laser source |
| 92 | laser housing |
| 95 | laser beam |
| 100 | single head precision precursor delivery and curing system |
| 200 | precision precursor simultaneous delivery and curing system |
| 300 | two-sided precursor delivery system for rigid or flexible substrate |

What is claimed is:

1. A method of making a charge containing element comprising the steps of:
   (a) depositing and patterning a dielectric material on a surface wherein the dielectric material includes a metallo-organic component and a liquid component; and
   (b) thermally decomposing in an atmosphere having oxygen by heat applied from IR laser light to the deposited dielectric material to substantially evaporate the liquid component to cause the metallic element in the metallo-organic component to react with oxygen to provide a metal oxide causing the dielectric material to have charge-holding properties.

2. The method of claim 1 wherein the depositing and patterning step is provided by a precursor delivery head which responds to electrical signals to provide the dielectric material at predetermined positions.

3. The method of claim 1 further including providing a conductive layer over a substrate and forming the patterned dielectric material on such conductive layer.

4. The method of claim 1 wherein the conductive layer provides a substrate.

5. The method of claim 1 wherein the metallo-organic component includes Zirconium 2-Ethylhexanoate, Zirconium Octoate or Zirconium Tetra-n-butoxide, and a dopant including Y-Acetylacetonate and the liquid is a solvent, wherein such solvent dissolves such metallo-organic component and the dopant.

6. A method of making capacitors on a printed circuit board comprising the steps of:
   (a) providing a substrate and one or more conductive portions on such substrate;
   (b) depositing and patterning a dielectric material on the printed circuit board so that conductive portion(s) are in contact with such dielectric material and wherein the dielectric material includes a metallo-organic component and a liquid component; and
   (c) thermally decomposing in an atmosphere having oxygen by heat applied from IR laser light to the deposited dielectric material to substantially evaporate the liquid component to cause the metallic element in the metallo-organic component to react with oxygen to provide a metal oxide causing the dielectric material to provide capacitors having charge-holding properties.

7. The method of claim 6 wherein the depositing and patterning step is provided by a precursor delivery head which responds to electrical signals to deposit the dielectric material.

8. The method of claim 6 wherein the metallo-organic component includes Zirconium 2-Ethylhexanoate, Zirconium Octoate or Zirconium Tetra-n-butoxide, and a dopant including Y-Acetylacetonate and the liquid is a solvent, wherein such solvent dissolves such metallo-organic component and the dopant.

9. The method of claim 8 wherein the substrate is made of a flexible material.

10. The method of claim 9 wherein the flexible material includes metals, alloys, polymers, organics, inorganics, composites, glasses, paper, photographic film, magnetic media, or ceramic substrates or combinations thereof.

11. The method of claim 8 wherein the dielectric material is deposited in layers.

12. The method of claim 6 wherein the steps (a) and (b) at least partially are performed sequentially.

13. The method of claim 6 wherein the dielectric material is deposited on one surface of the substrate and further including forming capacitors on top and bottom surfaces of the substrate.

14. The method of claim 6 further including a substrate on a surface of which the dielectric material is deposited using a precursor delivery head and further depositing conductive material on another surface by another delivery head.

15. The method of claim 14 wherein the substrate is flexible.

16. A capacitor made in accordance with the method of claim 1.

17. A method of making capacitors and conductors connected to such capacitors on a printed circuit board comprising the steps of:
   (a) providing a substrate;
   (b) depositing and patterning a dielectric material on the printed circuit board so that portions of the patterned dielectric material correspond to conductors and other portions correspond to capacitors which are in electrical contact with the conductors and wherein the dielectric material includes a metallo-organic component and a liquid component; and
   (c) thermally decomposing in an atmosphere having oxygen by IR laser light of first or second wavelengths the deposited dielectric material to substantially evaporate the liquid component to cause the metallic element in the metallo-organic component to react with oxygen to provide a metal oxide causing the dielectric material to provide conductors and capacitors in response to the first and second wavelengths of laser light respectively having charge-holding properties.

* * * * *